United States Patent
Al-Karaghouli et al.

(10) Patent No.: US 12,259,422 B2
(45) Date of Patent: Mar. 25, 2025

(54) METHOD AND SYSTEM FOR INSULATION MONITORING IN THE AIRCRAFT POWER DISTRICT AND ITS LOADS

(71) Applicant: Hamilton Sundstrand Corporation, Charlotte, NC (US)

(72) Inventors: Ali Khalid Al-Karaghouli, West Midlands (GB); Grzegorz Popek, Birmingham (GB)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 265 days.

(21) Appl. No.: 18/150,462

(22) Filed: Jan. 5, 2023

(65) Prior Publication Data
US 2023/0213571 A1  Jul. 6, 2023

(30) Foreign Application Priority Data
Jan. 5, 2022 (EP) ................................. 22275001

(51) Int. Cl.
G01R 31/12 (2020.01)
G01R 31/00 (2006.01)

(52) U.S. Cl.
CPC ....... *G01R 31/1272* (2013.01); *G01R 31/008* (2013.01)

(58) Field of Classification Search
USPC ........................................................ 324/551
See application file for complete search history.

(56) References Cited

U.S. PATENT DOCUMENTS

| | | | |
|---|---|---|---|
| 8,310,242 B2 | 11/2012 | Itten et al. | |
| 9,797,955 B2 | 10/2017 | Okada et al. | |
| 10,644,635 B2 * | 5/2020 | Ganesan | H02K 11/27 |
| 2001/0048310 A1 | 12/2001 | Takahashi | |
| 2008/0150549 A1 | 6/2008 | Horikoshi et al. | |

FOREIGN PATENT DOCUMENTS

KR  101031743 B1  4/2011

OTHER PUBLICATIONS

Abstract for KR101031743 (B1), Published: Apr. 29, 2011, 1 page.
European Search Report for Application No. 22275001.0, mailed Jul. 15, 2022, 19 pages.

* cited by examiner

*Primary Examiner* — Farhana A Hoque
(74) *Attorney, Agent, or Firm* — CANTOR COLBURN LLP

(57) ABSTRACT

A method for monitoring insulation in a motor drive circuit configured to convert DC power from a power source to AC power to drive a motor. The method includes boosting a DC link voltage of an inverter of the motor drive, isolating the motor drive circuit from the power source; performing at least one isolation test by providing a current path through components of the motor drive and preferably a motor connected to the output of the inverter to be tested; and monitoring the current during each isolation test to detect partial discharge or excessive leakage from the current path, thereby indicating that there exists defects in the insulation in the current path.

15 Claims, 2 Drawing Sheets

METHOD AND SYSTEM FOR INSULATION MONITORING IN THE AIRCRAFT POWER DISTRICT AND ITS LOADS

CROSS-REFERENCE TO RELATED APPLICATIONS

This application claims priority to European Patent Application No. 22275001.0 filed Jan. 5, 2022, the entire contents of which is incorporated herein by reference.

FIELD

This invention relates to the monitoring of insulation within a power system.

BACKGROUND

Power districts form a part of aircraft's power distribution. Each power district can consist of a power rack with multiple DC fed inverters, of which outputs can be multiplexed and/or paralleled by a switching matrix to drive various loads (e.g. electric motors). Within such systems, as with many electrical systems, wires, motor windings and the like should be electrically insulated so as to avoid unwanted electrical discharge.

As is particularly apparent in aircraft systems, any insulation has to be resistant to environmental constrains. For example, at high altitudes, the decreased air pressure leads to a reduced threshold for corona discharges (electrical discharges caused by the ionization of a fluid, such as air, surrounding a charged conductor). Furthermore, within aircraft there may be various corrosive chemicals, extreme temperatures, and the like which can lead to the degradation of insulation. This, combined with new, challenging design paradigms that have lead to an increased power density and efficiency within aircraft (e.g. high voltages and wide band gap devices like SiC), means that insulation within aircraft power systems remains of utmost importance.

Recently, there has been developments to utilize high voltage (e.g. voltages of 1000 v or higher) power systems in aircraft, to allow for increasing power demand on board of aircraft. Such systems may have no de-rating standards, little to no empirical data and no in-service reliability information on insulation subjects in low pressure environments. This makes it difficult to design suitable, reliable systems for use in such situations. The use of high voltage exacerbates the issues outlined above, and can lead to an increased occurrence of unwanted discharges, and potential catastrophic failure.

The degradation of the condition of insulation can raise long term reliability concerns and, in the field of aircraft, can lead to hard or intermittent faults in aircraft protection systems. These issues can lead to long investigations and result in unscheduled maintenance, which can result in aircraft being grounded for an extended period of time. Additionally, whilst minor faults may not lead to the requirement of taking aircraft out of service, it is desirable to identify such faults as early as possible, such that they may be fixed during scheduled maintenance, and before they cause more major failures.

In order to mitigate such problems, it is possible to simply add excessive insulation to the cables and windings where insulation is necessary. However, such a solution adds undesirable weight, which should be minimised in aircraft applications.

SUMMARY

From a first aspect, there is provided a method for monitoring insulation in a motor drive circuit configured to convert DC power from a power source to AC power to drive a motor, the method comprising of boosting a DC link voltage of an inverter of the motor drive; isolating the motor drive circuit from the power source; performing at least one isolation test by providing a current path through components of the motor drive and preferably a motor connected to the output of the inverter to be tested; and monitoring the current during each isolation test to detect partial discharge or excessive leakage from the current path, thereby indicating that there exists defects in the insulation in the current path.

Thus it will be seen that, in accordance with examples of the disclosure, that isolation that is present within a motor drive and/or anything connected to the output of the motor drive may be routinely tested, before failure. The method may utilise an inverter topology to direct current through relevant portions of the power systems that are to be monitored.

The step of boosting the DC link voltage may comprise controlling the inverter module to cause a short circuit between a high voltage DC rail, HVDC+, and low voltage DC rail, HVDC−, thereby increasing the DC link voltage resulting from a boost operation of an impedance network. In this way, by providing a short between the HVDC+ and HVDC− rails, it is possible to boost the voltage to a level that reflects the operating level of the power system, and thereby accurately determine whether there is or will be any faults in the insulation during normal operation.

The step of isolating the motor drive circuit from the power source may comprise of turning off bidirectional switches on each of the high voltage DC rail and the low voltage DC rail during a zero current demand resulting from the boosting of the DC link voltage. This advantageously utilises a zero current demand that results from the boost condition so as to disconnect switches that may require such a zero current demand so as to be operated.

The method may comprise the steps of storing the monitored current during each isolation test; and using the stored current to predict the remaining life or present state of the insulation of the current path associated with each isolation test. In this way, the state of the insulation may be tracked over time to give an early indication of failure, or the information may be used to schedule a maintenance to address any issues that may be forming with relation to the insulation.

The step of monitoring the current during each isolation test may comprise: measuring the current on a low voltage DC rail, HVDC−, by closing a first switch thereby allowing current to pass through a first current monitoring circuit, and/or measuring the current on a high voltage DC rail, HVDC+, by closing a second switch thereby allowing current to pass through a second current monitoring circuit. The switches allow for a reference point through which the current may flow, thereby allowing the current measurement circuits to measure for leakage, wherever appropriate.

The step of performing at least one isolation test may comprise at least one of: testing the insulation of the inverter top switches only; testing the insulation of the inverter bottom switches, as well as the insulation of the motor windings and harness of a motor connected to the output of the inverter; and testing the insulation of the inverter bottom switches only. This may be effected by controlling the switches of an inverter in a known fashion so as to direct current through components of interest, and measuring leakage therethrough—thereby giving an indication of any insulation faults on those chosen components. The presence of various separate tests may allow for the exact source of leakage to be accurately identified, and therefore reduce time required in scheduled maintenance to identify any errors.

The motor drive may be a first motor drive of a plurality of motor drives, and each of the plurality of motor drives may be connected at least one of a plurality of motors via a reconfiguration matrix. The reconfiguration matrix may connect a desired motor drive of the plurality of motor drives to the output of the first motor drive such that the insulation of the desired motor drive may be tested. In this way, a single motor drive that is configured to perform such testing may be used to not only test insulation of itself (and one or more motors which it powers), but it may equally be able to test the insulation of other motor drives that are provided in a multiplexed control system.

From a second aspect, there is provided a motor drive that is suitable for performing any of the methods detailed above. The motor drive comprises of a first bidirectional switch on a high voltage DC rail, HVDC+, configured to connect to a high voltage terminal of a DC power source; a second bidirectional switch on a low voltage DC rail, HVDC−, configured to connect to a low voltage terminal of a DC power source; an inverter configured to convert DC power across HVDC+ and HVDC− to an AC power output; an impedance network configured to provide a local energy storage for the inverter; a first current monitoring circuit connected to HVDC−; and a second current monitoring circuit connected to HVDC+.

Such a motor drive may be able to carry out the above methods, such that it is provided with the ability to self-diagnose, or predict whether there may be an impending failure in its isolation, or equally in the isolation of any other motor drives/motors that may be connected thereto.

The impedance network may comprise a first inductor on HVDC+ and a second inductor on HVDC−, with two capacitors in an X-shape across the inductors or another equivalent network. Such an impedance network may allow for the voltage within the motor drive to be effectively boosted.

The inverter module may be based on IGBTs, Mosfet SiC, Si devices or relays. The motor drive may comprise an EMC filter configured to filter input DC power. The motor drive may also comprise a first switch in series with the first current monitoring circuit, and a second switch in series with the second current monitoring circuit.

In a third aspect, there is provided a system comprising a power source; the motor drive as described above; and a motor. Such a system may be able to diagnose faults in insulation in any parts of the system.

In a fourth aspect, there is provided system comprising a plurality of motor drives, wherein at least one of the motor drives is a first motor drive, and is a motor drive as described above; a plurality of motors; and each of the plurality of motor drives is connected at least one of the plurality of motors via a reconfiguration matrix.

The reconfiguration matrix may be further configured such that one of the plurality of motor drives may be connected to the output of the first motor drive, such that the first motor drive can test the insulation of any of the plurality of motor drives. In this way, a single motor drive that is configured to be able to perform testing of insulation may be utilised to test the insulation of any of the other motor drives or motors of the system.

BRIEF DESCRIPTION OF THE DRAWINGS

Certain examples of the disclosure will now be described, by way of example only, with reference to the accompanying drawings, in which.

DETAILED DESCRIPTION

In order to address the above issues, the present invention provides a method, as well as a system that monitors the health of insulation in a power system. Whilst the examples described herein are described with reference to an aircraft's power districts and motor drive systems, as would be understood, the present invention may find use in other applications, and is not limited to its use within aircraft.

Figure 1:
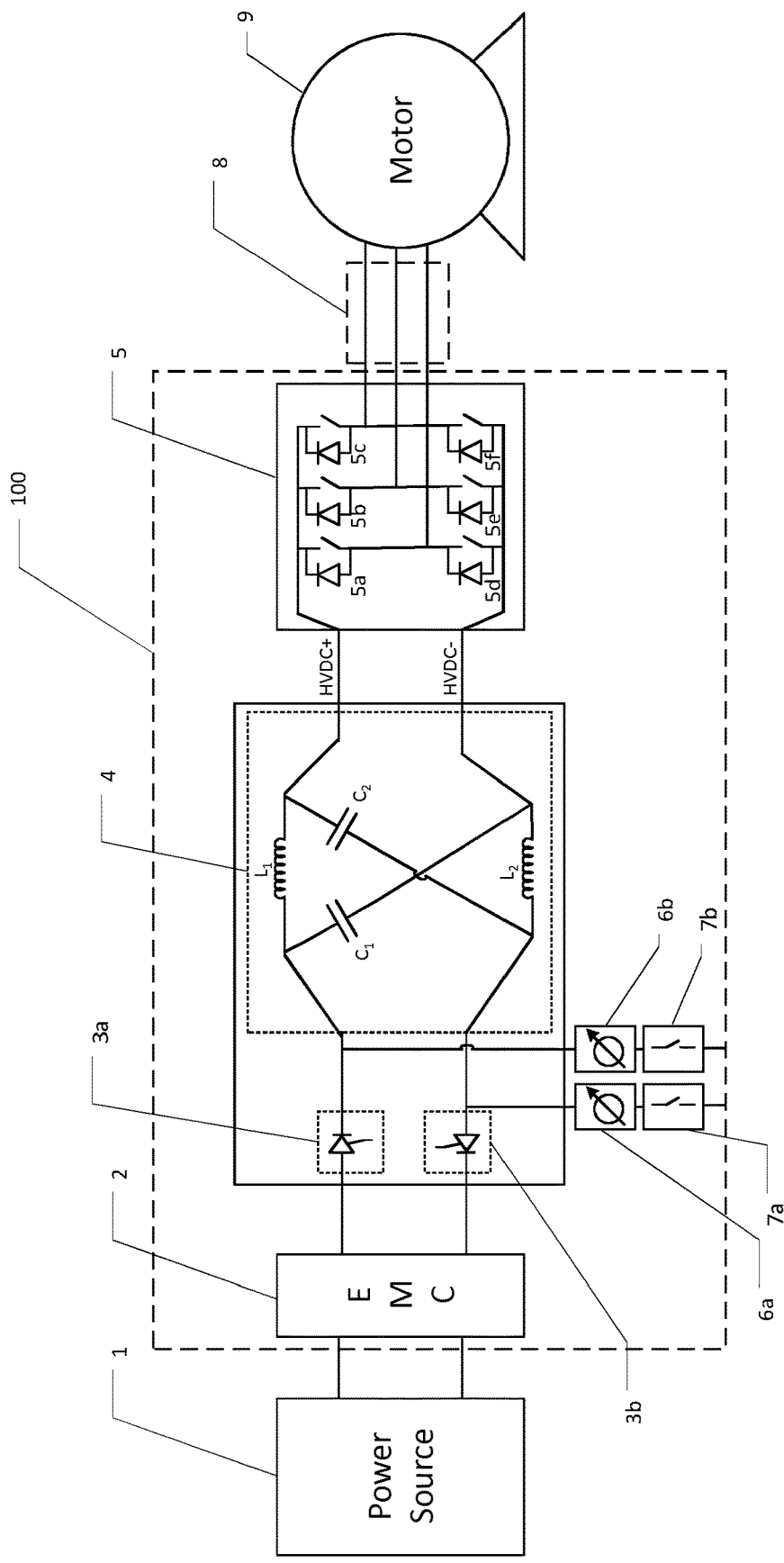
FIG. 1 is a schematic diagram of a motor drive system.

FIG. 1 shows and example motor drive system capable of monitoring the insulation at various points within the motor drive system.

The system comprises a power source 1 connected to a motor harness 8, and a motor 9 via a motor drive 100. The motor drive 100 comprises an EMC filter 2, bidirectional switches 3a and 3b, an impedance network 4, a power bridge/inverter 5, current monitoring circuits 6a and 6b, and switches 7a and 7b.

In normal operation, DC power from the power source 1 may be filtered by an EMC filter, and passed through a closed bidirectional switch 3a connected to the positive terminal, and a closed bidirectional switch 3b connected to the negative terminal of the power source 1. The closed bidirectional switches may be, for example, thyristors. The output of the switches 3a and 3b is connected the impedance network 4 (e.g. a lattice network with two inductors L1, L2, one on each rail, and two capacitors C1, C2 in an X-shape across the inductors, or an equivalent circuit), which functions as a local energy storage for the power bridge/inverter 5. High voltage DC (HVDC+) is provided on the HVDC+ rail to top switches 5a, 5b, 5c of the inverter 5, and low voltage DC (HVDC−) is provided on the HVDC− rail to bottom switches 5d, 5e, 5f of the inverter 5. The power/bridge/inverter then provides AC power to the motor 9 via harness 8. The inverter module 5 can be based on any switching devices, for example IGBTs, SiC or relays.

By providing the impedance network 4 in the motor drive 100, it is possible to boost the input voltage by shorting HVDC+ to HVDC− in a resonant interaction. Such a resonant interaction causes the input current to drop to zero, thereby allowing the voltage at its output to be greater than the voltage at its input. Additionally, with such a zero current at the input, it is possible to disconnect the bidirectional switches 3a and 3b from the DC grid (i.e. the power source 1) during the resulting zero current condition. In this way, the impedance network can function as a decoupling circuit, thereby allowing for decoupling of the load (i.e. the inverter 5 and motor 9) from the source (power supply 1, and filter 2 by opening the switches 3a and 3b and acts like a zero current disconnect for the DC grid.

In order to determine whether there has been any degradation of the insulation at various points within the system, the voltage in the load may be boosted, as outlined above, to a desired level to determine the characteristics of the circuits at said level. For example, it may be desirable to determine whether there is any discharge at the level of normal operation. In modern aircraft systems, this can be in the excess of 1000 v or higher. Therefore, in such systems, it is desirable to boost the voltage in the load to such a level, and then to decouple load.

Additionally, by boosting the voltage in the load and reducing the current demand to zero, it is possible to turn off switches 3a and 3b. For example, these switches may be thyristors, which may be turned off when there is zero current demand. Once the load has been decoupled, then it is possible to determine whether there is any excessive leakage current which may be attributed to a failure in the insulation. In an ideal system, with perfect insulation, there would be no leakage, or limited leakage current from the load and system insulation. The voltage would therefore remain at the boosted level.

Therefore, in order to test for faults in the insulation of system 1, firstly, the DC link voltage is boosted to the desired level. In the example of FIG. 1, this could may be achieved by controlling the inverter module 5 to cause a momentary short circuit between HVDC+ rail and HVDC− rail. For example, this may be done by turning switches 5a∥5d, 5b∥5e, 5c∥5f on, or all the switches on at the same time. This results in a momentary short, and during this operation, the equivalent capacitance and inductance of the impedance network causes a slightly increased current flow through its inductive part. When the switches are disconnected, the energy that is stored in the inductive components creates a voltage boost, which is then stored in the capacitors. As would be appreciated, the boost operation is controlled by the length of time the short is applied, and may be controlled in, for example, a PWM fashion. The result is an increase in the DC link voltage due to the presence of the impedance network 4.

Once the DC link voltage is boosted, the motor dive circuit may be isolated. This is achieved by turning off switches 3a and 3b, which is possible during zero current demand from the power source 1. Such a zero current demand results when the inverter switches are turned on momentarily to short HVDC+ and HVDC−, as described above.

At this point, when the DC link voltage has been boosted, and the motor drive circuit isolated, then it is possible to perform isolation tests.

In a standalone inverter (i.e. where the motor cables are fixed to the output of the motor drive 100), it is possible to test insulation of the motor drive first and then insulation of the load. For example, in the example of FIG. 1, the following tests may be performed:

TABLE 1

| Test No. | Test objectives | Method |
| --- | --- | --- |
| 1 | Test the insulation of inverter top switches 5a, 5b, 5c only | Turn OFF 5a, 5b and 5c and 7b, Turn ON 5d, 5e, 5f and 7a. |
| 2 | Test the insulation of inverter bottom switches 5d, 5e, 5f, motor windings and harness 8. | Turn ON 5a, 5b, 5c and 7b, Turn OFF 5d. 5e, 5f and 7a. |
| 3 | Test the insulation of inverter bottom switches 5d, 5e, 5f only | Turn OFF 5d, 5e, 5f and 7a, Turn ON 5a, 5b, 5c and 7b, and disconnect the load (e.g. the motor windings and the harness) |

In this way, by providing only certain current paths in the floating system, it is possible to isolate certain parts of the system, and therefore identify the exact source of any leakages (and therefore, where there may exist a failure in the insulation).

By providing the above tests, it is possible to determine not only the overall leakage within the system, but also the leakages separately of the inverter top switches, the inverter bottom switches, as well as the load (motor/motor harness). In this way, these tests allow for a determination of leakage of the inverter top switches only, and a determination of the leakage of the bottom switches only. Then, by connecting the load, it is possible to determine the combined leakage of the inverter bottom switches, and the motor/motor harness. This will be a sum of the leakage within the inverter bottom switches, as well as the leakage in the motor/motor harness. By subtracting the known leakage in the inverter bottom switches from the combined leakage of the inverter bottom switches and the motor/motor harness, it is possible to work out the leakage (and therefore the insulation condition) of the motor/motor harness itself, thereby more accurately identifying the source of any issues. Of course, a similar method may be used by connecting the load in test 1, thereby measuring the combined leakage of the top switches and the load.

The load may be disconnected in any known manner. For example, a multiplexer may be used to disconnect the load. Additionally/alternatively, the load may be disconnected by a physical removal or by isolating the load using switches.

During each test, the current is monitored by current monitoring circuits 6a, and 6b (whichever is connected), which are able to detect any partial discharge or excessive leakage occurs. It is possible to store those measurements and form predictions about remaining life or present state of insulation. Specifically, switches 7a and 7b may switch ON or OFF, thereby creating a reference point for the current to go through, and enabling the relevant monitoring circuit 6a and/or 6b to measure the current passing through.

Figure 2:
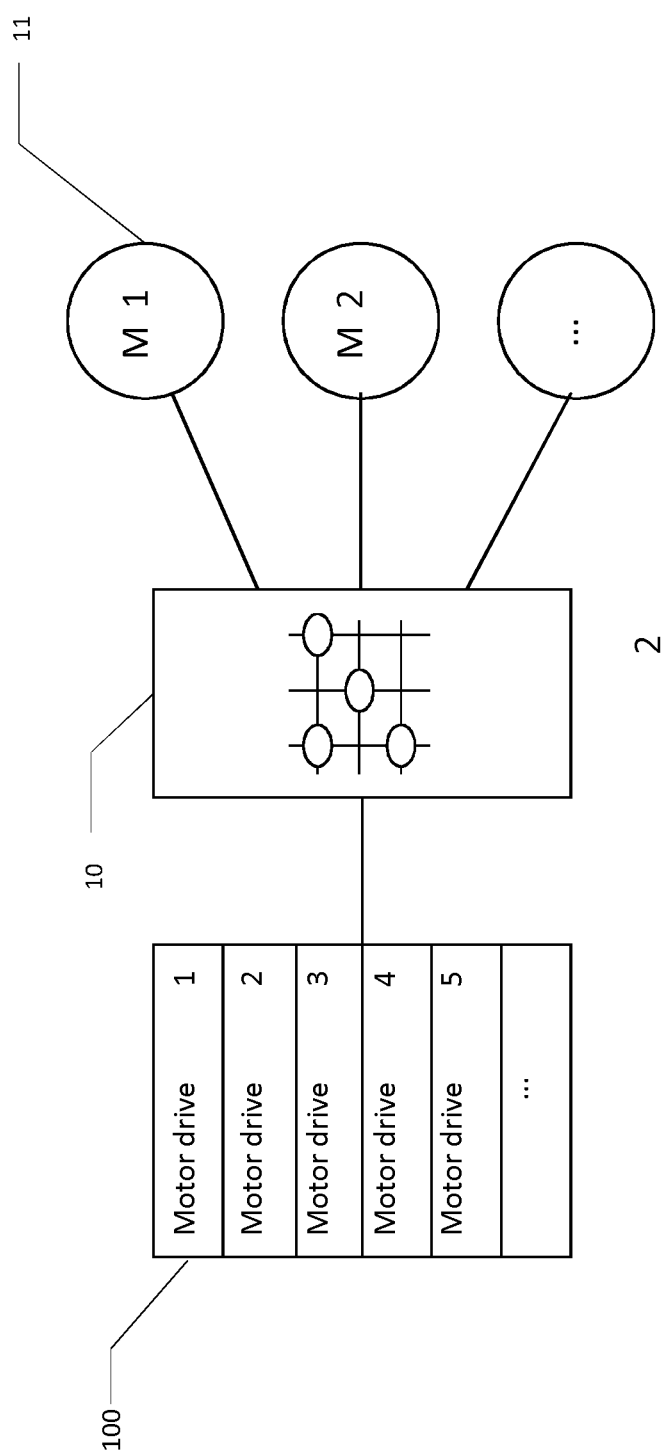
FIG. 2 is a schematic diagram of a power district, such as a power district of an aircraft.

FIG. 2 shows a power district architecture example where multiple motor drives 100 may be combined in parallel to drive one or more motors 11, depending on the system requirements. This is managed through a reconfiguration matrix 10 (for example, a multiplexer) to connect the required motor(s) 11 to the required motor drive(s) 100, thereby allowing each motor drive 100 to drive any one of the motors 11, M1, M2 etc. Such a power district may be found in, for example, an aircraft.

The insulation testing method set out above may still be used in this setup, and a single motor drive can test all the connected motors. For example, motor drive 1 can have the circuit configuration 100 shown in FIG. 1. Following the above steps above, test 2 (shown in Table 1 above) can be used to test all of the remaining motor drives, along with all the motors 11 and their associated harnesses with only a single detection circuit 6a, 6b. In this way, whilst the reconfiguration matrix 10 may be is used to multiplex loads (i.e. motors) during normal operation, it may be used to test other insulation within the system. For example, the insulation testing motor drive 1 (having a configuration 100 as shown in FIG. 1) can be used as an "insulation tester" and connect to the outputs of motor drive 2 via the reconfiguration matrix 10. The connection of another motor drive to the outputs of motor drive 1 allows for the insulation of motor drive 2 (or any motor load within the system) to be checked. It is also possible to test insulation of other power blades in the power rack. As the leakage of the inverter of the motor drive can be tested in isolation, then it is possible to attribute any further leakage to the load that is connected by the multiplexer.

Such a method allows the system to monitor the health of the insulation in the power district as a part of start-up or diagnostic routine. For example, the above method may be performed upon a regular start-up of an aircraft, in order to accurately track any potential leakage, and how it might be developing over time. This data may be used during a scheduled repair, or used to prompt the scheduling of a repair to fix the identified issues. Additionally, or alternatively, such a routine may be performed during maintenance in order to determine whether certain components in a motor drive, or within a motor should be serviced.

By monitoring partial discharge, it is possible to assess whether there has been any degradation of the insulation on a certain channel. If partial discharge is detected, then a scheduled repair may planned be to address the source of the partial discharge, before it results in accelerated ageing of the insulation. Additionally or alternatively, in the case where partial discharge is detected at a particularly high voltage, then a decision may be made to reduce the operating voltages to a safe level where discharge no longer occurs, until a repair may be made.

By effectively monitoring the health of the insulation of a power district, whether that be as part of aircraft start-up or diagnostic routine, it is possible to mitigate the issues outlined above by detecting degradation of insulation before it results in total failure. Failure of insulation will increase leakage current to a very high level, which may eventually be detected by the aircraft power distribution system (GCI), where the faulty power branch will be disconnected and backup functionality will be deployed. This reduces functionality which can lead to a worsened customer experience, and result in unscheduled maintenance. At this point, it would otherwise be necessary to investigate during maintenance to identify the cause of the issues. However, the circuits and methods outlined herein would allow for a single weight neutral test routine to be used to monitor the state of the insulation of a standalone motor drive or whole power district.

Further, the method considered herein may be used during the design of aircraft power districts, for example to optimize isolation thickness in cables. During design, by knowing that the state of the isolation is going to be monitored, less isolation can be used, which can in turn help to manage the heating effects of bundled wires.

Such a method provides the ability to carry out diagnostic and prognostics for insulation in increasingly challenging environments for a selected load, and the ability to detect failures and identify its origins before they occur naturally helps in improving safety. This may be implemented with a cheap add on circuit that is capable of detecting leakage current and partial discharge, and which is also compatible for testing all elements of power district scalable systems. By monitoring the state of the insulation, and thereby by detecting when there is an appreciable amount of degradation in the insulation, potential faults may be identified at their exact location and addressed before they become critical. This reduces down time, and unexplained aircraft protection trips, which can take substantial amount of time to identify the source of the failure. Further, in an emergency, the resonance network can be used as a HVDC zero current safety disconnect.

The invention claimed is:

1. A method for monitoring insulation in a power system comprising a motor drive circuit configured to convert DC power from a power source to AC power to drive a motor, the method comprising:
   boosting a DC link voltage of an inverter of the motor drive;
   isolating the motor drive circuit from the power source;
   performing at least one isolation test by providing a current path through components of the motor drive and preferably a motor connected to the output of the inverter to be tested;
   monitoring the current during each isolation test to detect partial discharge or excessive leakage from the current path, thereby indicating that there exists defects in the insulation in the current path.

2. The method of claim 1, wherein the step of boosting the DC link voltage comprises:
   controlling the inverter module to cause a short circuit between a high voltage DC rail, HVDC+, and low voltage DC rail, HVDC−, thereby increasing the DC link voltage resulting from a boost operation of an impedance network.

3. The method of claim 1, wherein the step of isolating the motor drive circuit from the power source comprises:
   turning off bidirectional switches on each of the high voltage DC rail and the low voltage DC rail during a zero current demand resulting from the boosting of the DC link voltage.

4. The method of claim 1, further comprising:
   storing the monitored current during each isolation test; and
   using the stored current to predict the remaining life or present state of the insulation of the current path associated with each isolation test.

5. The method of claim 1, wherein the step of monitoring the current during each isolation test comprises:
   measuring the current on a low voltage DC rail, HVDC−, by closing a first switch thereby allowing current to pass through a first current monitoring circuit, and/or
   measuring the current on a high voltage DC rail, HVDC+, by closing a second switch thereby allowing current to pass through a second current monitoring circuit.

6. The method of claim 1, wherein the step of performing at least one isolation test comprises at least one of:
   testing the insulation of the inverter top switches only;
   testing the insulation of the inverter bottom switches, as well as the insulation of the motor windings and harness of a motor connected to the output of the inverter; and
   testing the insulation of the inverter bottom switches only.

7. The method of claim 1, wherein the motor drive is a first motor drive of a plurality of motor drives, and each of the plurality of motor drives is connected at least one of a plurality of motors via a reconfiguration matrix, and
   wherein the reconfiguration matrix connects a desired motor drive of the plurality of motor drives to the output of the first motor drive such that the insulation of the desired motor drive may be tested.

8. A motor drive for performing method of claim 1, the motor drive comprising:
   a first bidirectional switch on a high voltage DC rail, HVDC+, configured to connect to a high voltage terminal of a DC power source;
   a second bidirectional switch on a low voltage DC rail, HVDC−, configured to connect to a low voltage terminal of a DC power source;
   an inverter configured to convert DC power across HVDC+ and HVDC− to an AC power output;
   an impedance network configured to provide a local energy storage for the inverter;
   a first current monitoring circuit connected to HVDC−; and
   a second current monitoring circuit connected to HVDC+.

9. The motor drive of claim 8, wherein the impedance network comprises a first inductor ($L_1$) on HVDC+ and a second inductor ($L_2$) on HVDC−, with two capacitors ($C_1$, $C_2$) in an X-shape across the inductors or another equivalent network.

10. The motor drive of claim 8, wherein the inverter module is based on IGBTs, Mosfet SiC, Si devices or relays.

11. The motor drive of claim 8, further comprising:
an EMC filter configured to filter input DC power.

12. The motor drive of claim 8, further comprising:
a first switch in series with the first current monitoring circuit, and a second switch in series with the second current monitoring circuit.

13. A system comprising
a power source;
the motor drive of claim 8; and
a motor.

14. A system comprising:
a plurality of motor drives, wherein at least one of the motor drives is a first motor drive as claimed in claim 8;
a plurality of motors;
wherein each of the plurality of motor drives is connected at least one of the plurality of motors via a reconfiguration matrix.

15. The system of claim 14, wherein the reconfiguration matrix is further configured such that one of the plurality of motor drives may be connected to the output of the first motor drive, such that the first motor drive can test the insulation of any of the plurality of motor drives.

\* \* \* \* \*